(12) United States Patent
Heo et al.

(10) Patent No.: US 10,778,249 B2
(45) Date of Patent: Sep. 15, 2020

(54) METHOD AND APPARATUS FOR DECIDING DECODING ORDER FOR SHUFFLED DECODING OF LDPC CODES

(71) Applicant: KOREA UNIVERSITY RESEARCH AND BUSINESS FOUNDATION, Seoul (KR)

(72) Inventors: Jun Heo, Seoul (KR); Tae Hyun Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 146 days.

(21) Appl. No.: 16/122,020

(22) Filed: Sep. 5, 2018

(65) Prior Publication Data

US 2019/0165812 A1    May 30, 2019

(30) Foreign Application Priority Data

Nov. 30, 2017    (KR) .......................... 10-2017-0163178

(51) Int. Cl.
    *H03M 13/11*    (2006.01)

(52) U.S. Cl.
    CPC ...... *H03M 13/1131* (2013.01); *H03M 13/114* (2013.01); *H03M 13/1111* (2013.01); *H03M 13/1114* (2013.01); *H03M 13/1162* (2013.01); *H03M 13/1182* (2013.01)

(58) Field of Classification Search
    CPC .......... H03M 13/1131; H03M 13/1111; H03M 13/114; H03M 13/1114; H03M 13/1162; H03M 13/1182; H03M 13/3707; H03M 13/1137

USPC ......................................................... 714/800
See application file for complete search history.

(56) References Cited

U.S. PATENT DOCUMENTS

| 7,493,551 | B2 * | 2/2009 | Berens | H03M 13/118 714/790 |
| 2005/0149843 | A1 * | 7/2005 | Shen | H03M 5/20 714/800 |
| 2009/0006906 | A1 * | 1/2009 | Jacobsen | H03M 13/033 714/52 |

(Continued)

FOREIGN PATENT DOCUMENTS

| EP | 1992072 A1 * | 11/2008 | .......... H03M 13/356 |
| KR | 10-2013-0118162 A | 10/2013 | |

*Primary Examiner* — Albert Decady
*Assistant Examiner* — Enam Ahmed
(74) *Attorney, Agent, or Firm* — NSIP Law

(57) ABSTRACT

The method for shuffled decoding of LDPC codes includes calculating check-variable mutual information which is mutual information of a message propagating from a plurality of check nodes to a plurality of variable nodes by a check-variable mutual information calculating unit, calculating variable-check mutual information which is mutual information of a message propagating from the plurality of variable nodes to the plurality of check nodes connected to the plurality of variable nodes based on the check-variable mutual information by a variable-check mutual information calculating unit, and Calculating the entire mutual information which is a sum of variable-check mutual information for each of the plurality of variable nodes and determines an operation order of a variable node having the largest entire mutual information among the plurality of variable nodes to be next, by an operation order determining unit.

14 Claims, 8 Drawing Sheets

(56) References Cited

U.S. PATENT DOCUMENTS

| | | | |
|---|---|---|---|
| 2011/0126078 A1* | 5/2011 | Ueng | H03M 13/1111 |
| | | | 714/755 |
| 2014/0229788 A1* | 8/2014 | Richardson | H03M 13/036 |
| | | | 714/752 |
| 2018/0287636 A1* | 10/2018 | Rom | G06F 11/1048 |

* cited by examiner

[FIG. 1]
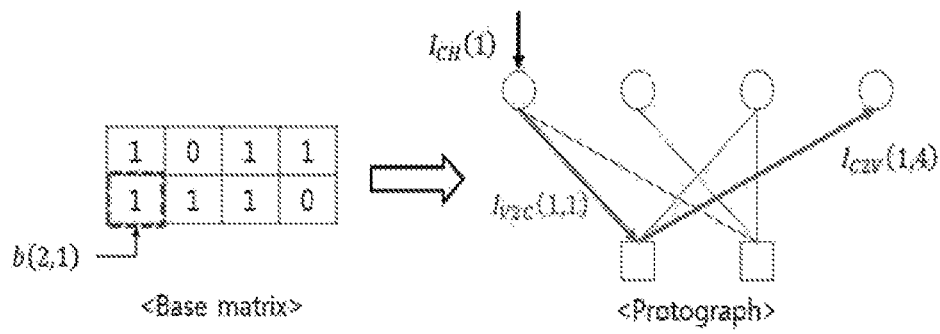
[FIG. 2]
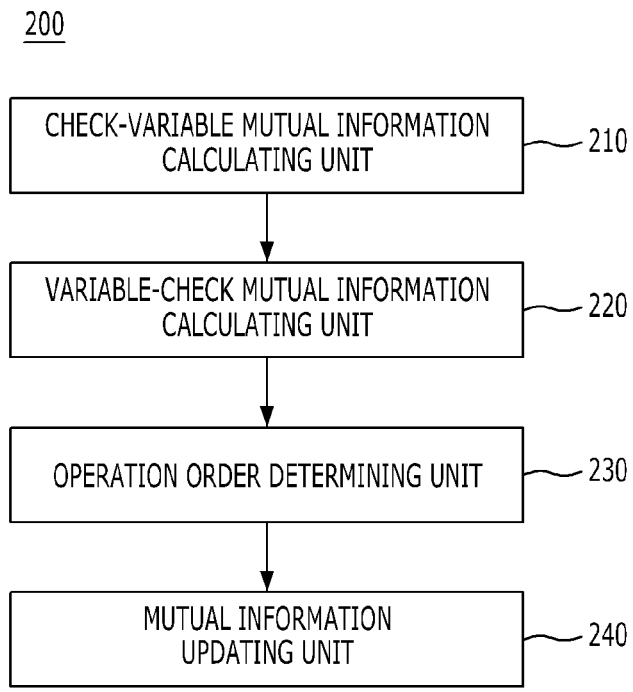

[FIG. 3]
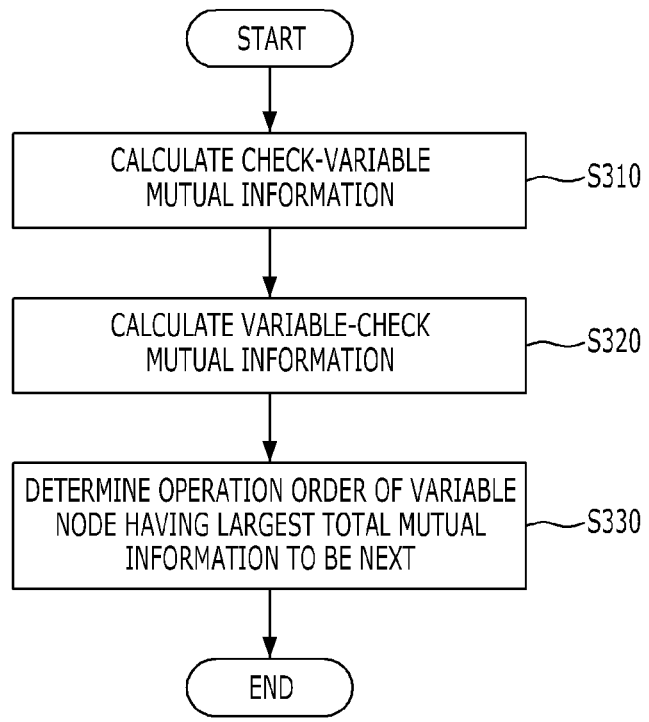

[FIG. 4]
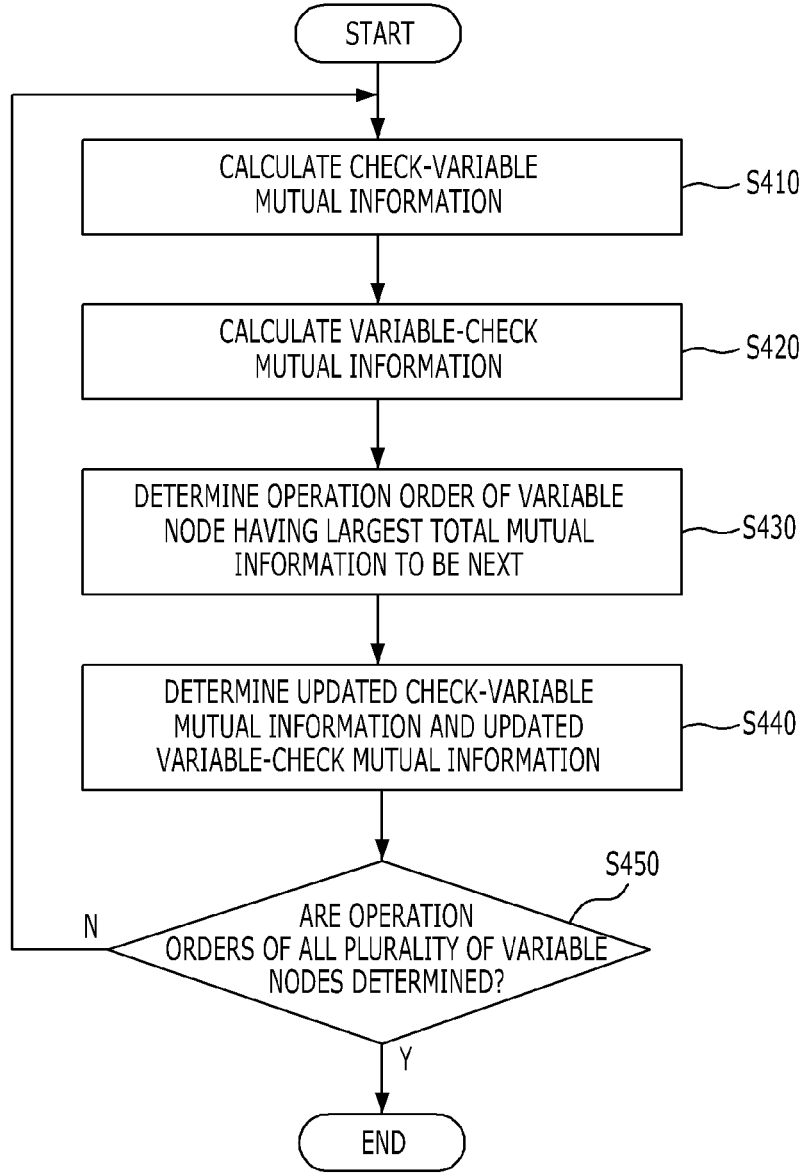

[FIG. 5]
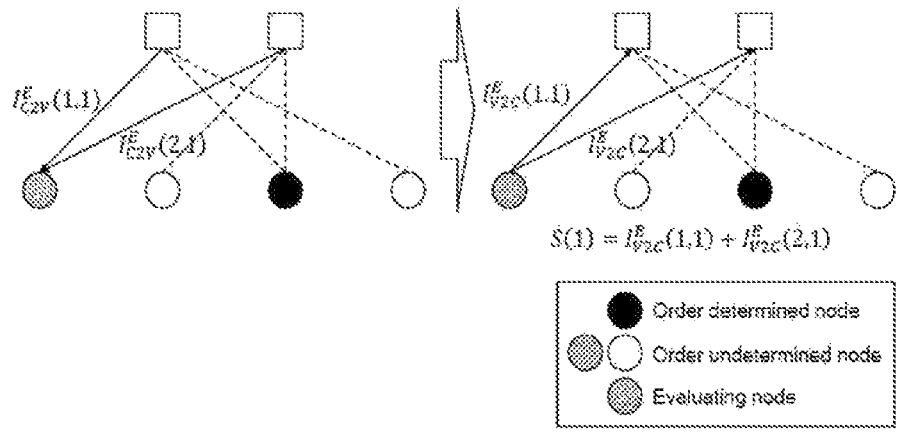
[FIG. 6a]
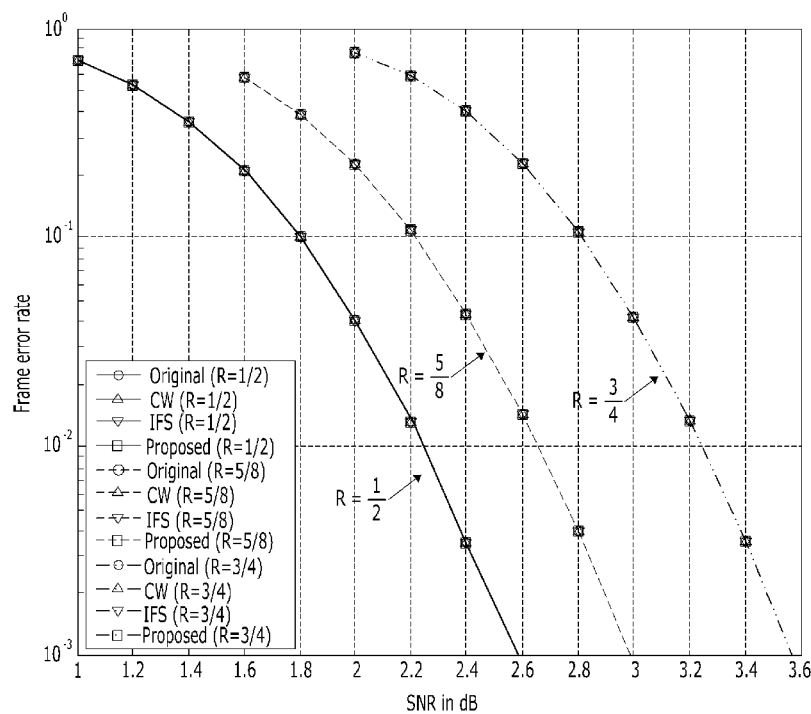

[FIG. 6b]
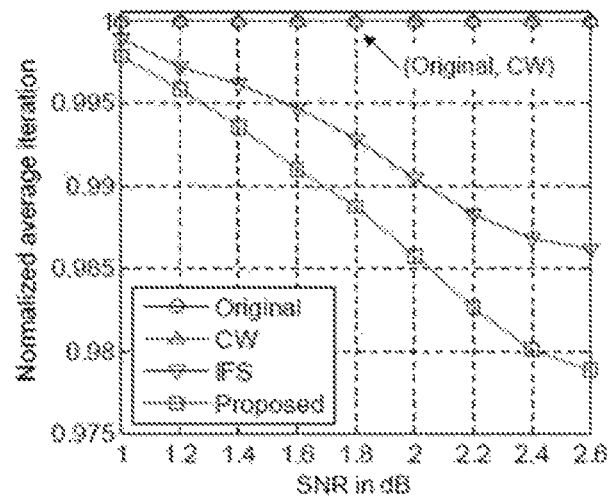
[FIG. 6c]
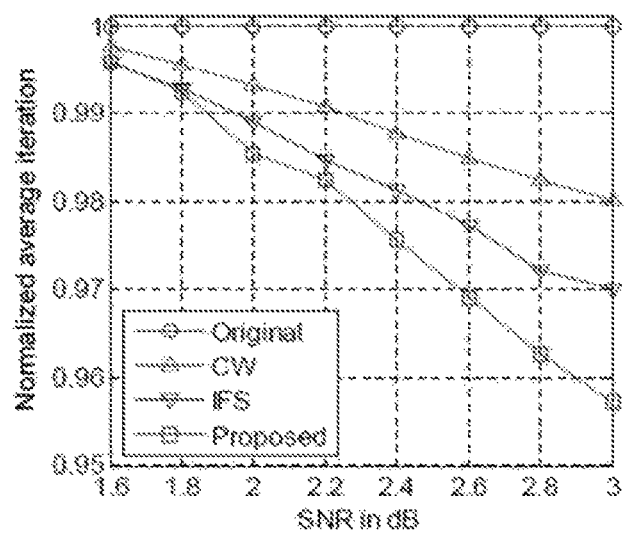

[FIG. 6d]
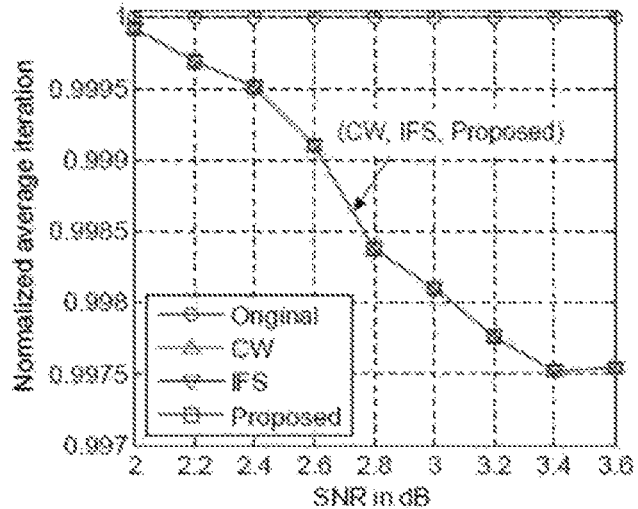
[FIG. 7a]
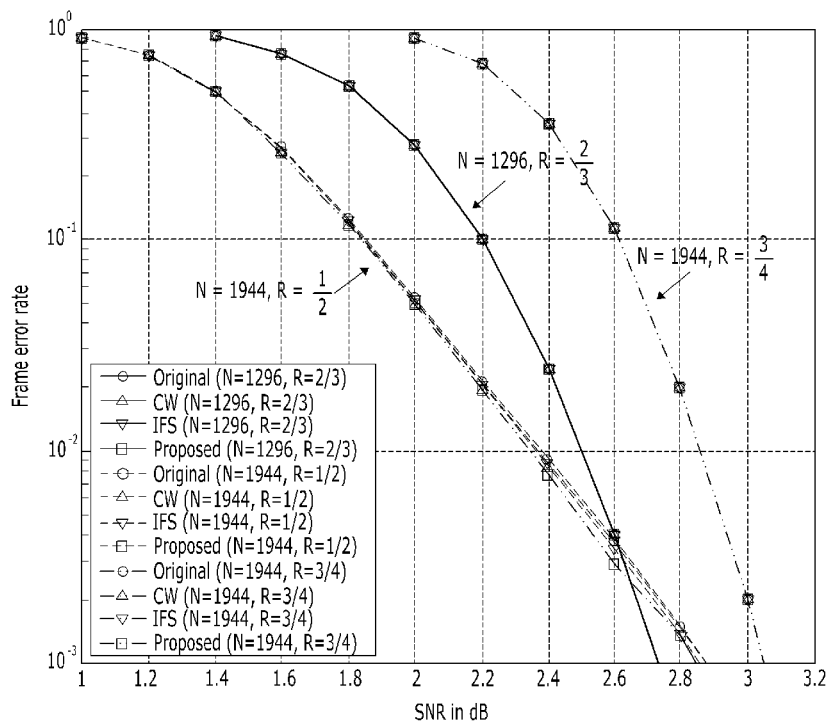

[FIG. 7b]
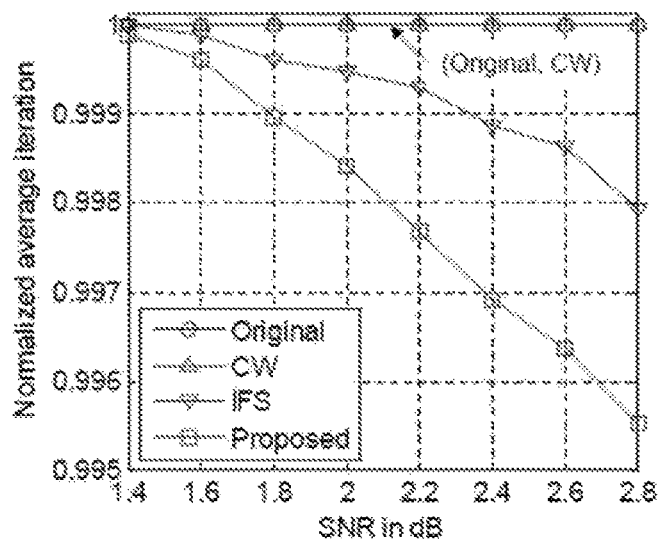
[FIG. 7c]
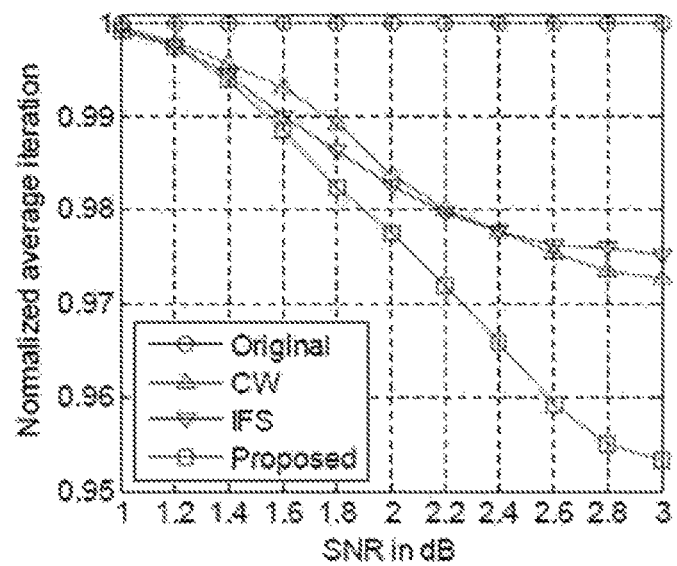

[FIG. 7d]
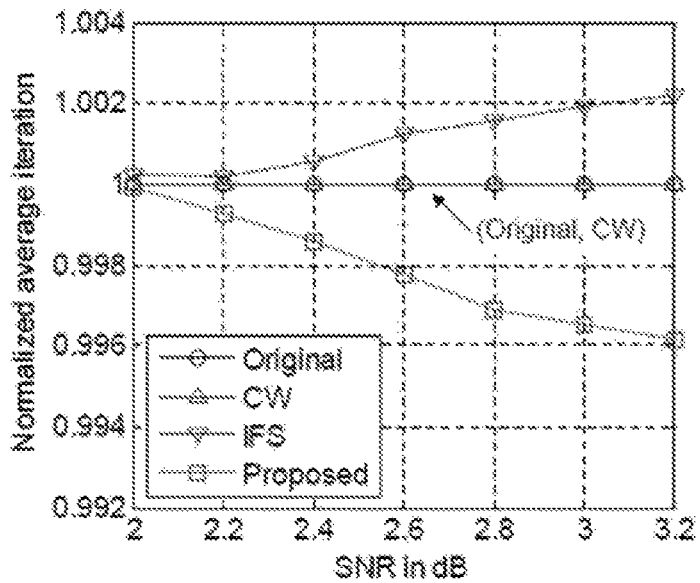
[FIG. 8]
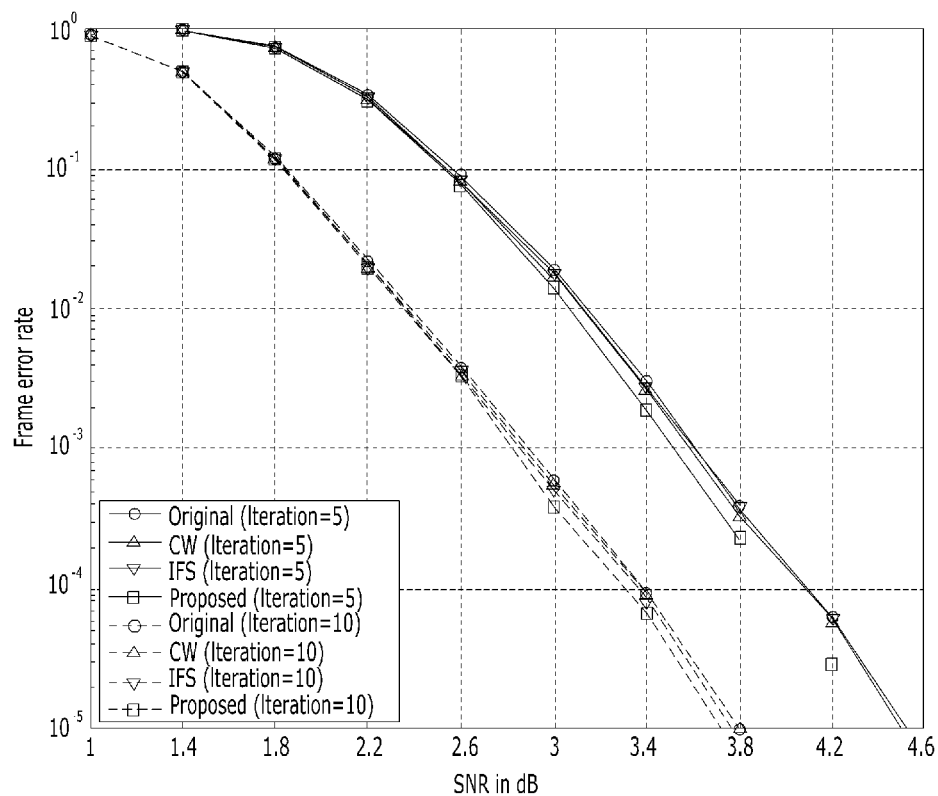

METHOD AND APPARATUS FOR DECIDING DECODING ORDER FOR SHUFFLED DECODING OF LDPC CODES

CROSS-REFERENCE TO RELATED APPLICATIONS

This application claims the priority of Korean Patent Application No. 10-2017-0163178 filed on Nov. 30, 2017, in the Korean Intellectual Property Office, the disclosure of which is incorporated herein by reference.

BACKGROUND

Field

The present disclosure relates to a method and an apparatus for determining a decoding order for shuffled decoding when low-density parity-check (LDPC) codes are decoded.

Description of the Related Art

An LDPC code is a linear block code suggested by Gallager and also an error correcting code which has an excellent error correcting capability close to a channel capacity suggested by Shannon. The LDPC code has been adopted as standards in various broadcast and wireless LAN technologies such as ATSC 3.0 or IEEE 802.11 and is broadly used for error correction in various storage devices including a flash memory.

The LDPC code restores a message through iterative decoding and each LDPC code is characterized by a parity check matrix. The parity check matrix may be represented by a Tanner graph. The Tanner graph is formed by variable nodes, check nodes, and edges showing the connection therebetween.

Such an LDPC decoder repeatedly performs an operation of information exchanged between the variable nodes and the check nodes which are connected to each other and performs the iterative decoding until it reaches a predetermined maximum number of iterations or satisfies a parity check equation.

The LDPC decoding is divided into parallel decoding, serial decoding, and partial-parallel serial decoding depending on an operating method.

In the parallel decoding, all check nodes simultaneously perform the operation and then all variable nodes simultaneously perform the operation. In the serial decoding, the check nodes or the variable nodes sequentially perform the operation.

Among the serial decodings, an algorithm which sequentially performs operations for the check nodes is layered decoding and an algorithm which sequentially performs operations for the variable nodes is shuffled decoding.

The serial decoding has an advantage in that the number of iterative decoding times required for the same error correcting capability is reduced by half as compared with the parallel decoding, but has a disadvantage in that a time required for one iterative decoding is much longer than that of the parallel decoding so that the entire operating time is longer than that of the parallel decoding.

In order to supplement the above-mentioned disadvantage, a partial-parallel serial decoding technique which divides check nodes or variable nodes into a plurality of groups and simultaneously performs the operation on nodes in the same group and sequentially performs the operation on the groups has been suggested. According to the serial decoding and the partial-parallel serial decoding, the number of iterative decoding times required until the parity check equation is satisfied may vary depending on the operation order of the nodes or the groups.

In the above-described shuffled decoding technique, in order to determine the operation order of the variable nodes, an algorithm which performs the operation in the order from a higher order of variable node to a lower order of variable node in consideration of a degree of the variable node has been proposed in the related art.

However, according to the algorithm which performs the operation in the order from a higher order of variable node to a lower order of variable node in consideration of a degree of the variable node, when a plurality of variable nodes has the same degree, it is difficult to determine the operation order. Further, even though the operation order is determined, a wrong operation order can be determined.

RELATED ART DOCUMENT

Patent Document (Patent Document 1) Korean Unexamined Patent Application Publication No. 10-2013-0118162 (Oct. 29, 2013)

SUMMARY

An object of the present disclosure is to calculate check-variable mutual information which is mutual information of a message propagating from a plurality of check nodes to a plurality of variable nodes connected to the plurality of check nodes, calculate variable-check mutual information which is mutual information of a message propagating from a plurality of variable nodes to a plurality of check nodes connected to the plurality of variable nodes based on the check-variable mutual information, calculate entire mutual information which is a sum of the variable-check mutual information for each of the plurality of variable nodes, and determine an operation order of a variable node having the largest entire mutual information among the plurality of variable nodes to be next.

Technical problems of the present disclosure are not limited to the above-mentioned technical problem(s), and other technical problem(s), which is (are) not mentioned above, can be clearly understood by those skilled in the art from the following descriptions.

According to an aspect of the present disclosure, a decoding order determining method for shuffled decoding of LDPC codes includes calculating check-variable mutual information which is mutual information of a message propagating from a plurality of check nodes to a plurality of variable nodes connected to the plurality of check nodes, by a check-variable mutual information calculating unit, calculating variable-check mutual information which is mutual information of a message propagating from a plurality of variable nodes to a plurality of check nodes connected to the plurality of variable nodes based on the check-variable mutual information, by a variable-check mutual information calculating unit, and calculating the entire mutual information which is a sum of variable-check mutual information for each of the plurality of variable nodes and determining an operation order of a variable node having the largest entire mutual information among the plurality of variable nodes to be next, by an operation order determining unit.

For example, the check-variable mutual information may be calculated based on a base matrix of LDPC codes and previous variable-check mutual information.

For example, an initial value of the previous variable-check mutual information may be set as mutual information on a signal received from a channel.

According to an aspect, the variable-check mutual information may be calculated based on a base matrix of LDPC codes, the check-variable mutual information, and mutual information on a signal received from a channel.

For example, the method may further include: updating the check-variable mutual information and the variable-check mutual information to determine updated check-variable mutual information and updated variable-check mutual information, based on a type of the variable node whose operation order is determined to be next, by a mutual information updating unit.

For example, the calculating of check-variable mutual information and the calculating of variable-check mutual information may be performed based on the updated check-variable mutual information and the updated variable-check mutual information.

For example, a decoding order determining cycle configured by the calculating of check-variable mutual information, the calculating of variable-check mutual information, the determining of a next operation order, and the determining of the updated check-variable mutual information and the updated variable-check mutual information may be repeatedly performed until all the operation orders of the plurality of variable nodes are determined.

According to another aspect of the present disclosure, a decoding order determining apparatus for shuffled decoding of LDPC codes includes: a check-variable mutual information calculating unit which calculates check-variable mutual information which is mutual information of a message propagating from a plurality of check nodes to a plurality of variable nodes connected to the plurality of check nodes, a variable-check mutual information calculating unit which calculates variable-check mutual information which is mutual information of a message propagating from a plurality of variable nodes to a plurality of check nodes connected to the plurality of variable nodes based on the check-variable mutual information, and an operation order determining unit which calculates the entire mutual information which is a sum of variable-check mutual information for each of the plurality of variable nodes and determines an operation order of a variable node having the largest entire mutual information among the plurality of variable nodes to be next.

For example, the check-variable mutual information may be calculated based on a base matrix of LDPC codes and previous variable-check mutual information.

For example, an initial value of the previous variable-check mutual information may be set as mutual information on a signal received from a channel.

According to an aspect, the variable-check mutual information may be calculated based on a base matrix of LDPC codes, the check-variable mutual information, and mutual information on a signal received from a channel.

For example, the apparatus may further include: a mutual information updating unit which updates the check-variable mutual information and the variable-check mutual information to determine updated check-variable mutual information and updated variable-check mutual information, based on a type of the variable node whose operation order is determined to be next.

For example, an operation of calculating check-variable mutual information and an operation of calculating variable-check mutual information may be performed based on the updated check-variable mutual information and the updated variable-check mutual information.

According to an aspect, a decoding order determining cycle configured by the operation of calculating the check-variable mutual information, an operation of calculating the variable-check mutual information, an operation of determining a next operation order, and an operation of determining the updated check-variable mutual information and the updated variable-check mutual information may be repeatedly performed until all the operation orders of the plurality of variable nodes are determined.

According to an aspect of the present disclosure, it is possible to calculate check-variable mutual information which is mutual information of a message propagating from a plurality of check nodes to a plurality of variable nodes connected to the plurality of check nodes, calculate variable-check mutual information which is mutual information of a message propagating from a plurality of variable nodes to a plurality of check nodes connected to the plurality of variable nodes based on the check-variable mutual information, calculate entire mutual information which is a sum of the variable-check mutual information for each of the plurality of variable nodes, and determine an operation order of a variable node having the largest entire mutual information among the plurality of variable nodes to be next, so that the operation order of the variable node may be more precisely calculated.

According to the operation order determined according to the exemplary embodiment of the present disclosure, the average number of iterative decoding times of the LDPC codes required to have the same error correction capability may be reduced, power consumption required for decoding may be reduced, and excellent error correction capability may be provided.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a view for explaining a base matrix in a method and an apparatus for determining a decoding order for shuffled decoding of LDPC codes according to an exemplary embodiment of the present disclosure;

FIG. 2 is a configuration diagram for explaining an apparatus for determining a decoding order for shuffled decoding of LDPC codes according to an exemplary embodiment of the present disclosure;

FIG. 3 is a flowchart for explaining a method for determining a decoding order for shuffled decoding of LDPC codes according to a first exemplary embodiment of the present disclosure;

FIG. 4 is a flowchart for explaining a method for determining a decoding order for shuffled decoding of LDPC codes according to a second exemplary embodiment of the present disclosure;

FIG. 5 is a view for explaining a method and an apparatus for determining a decoding order for shuffled decoding of LDPC codes according to an exemplary embodiment of the present disclosure;

FIGS. 6A, 6B, 6C, and 6D are views for comparing a frame error rate and a reduction rate of the average number of iterative decoding times with the related art when a method and an apparatus for determining a decoding order for shuffled decoding of LDPC codes according to an exemplary embodiment of the present disclosure are applied to an IEEE 802.11ad standard LDPC code;

FIGS. 7A, 7B, 7C, and 7D are views for comparing a frame error rate and a reduction rate of the average number of iterative decoding times with the related art when a method and an apparatus for determining a decoding order for shuffled decoding of LDPC codes according to an exemplary embodiment of the present disclosure are applied to an IEEE 802.11n standard LDPC code; and FIG. 8 is a view for comparing a frame error rate when a method and an apparatus for determining a decoding order for shuffled decoding of LDPC codes according to an exemplary embodiment of the present disclosure are applied to an IEEE 802.11n standard LDPC code and the maximum number of iterative decoding times is 5 and 10, with the related art.

DETAILED DESCRIPTION OF THE PREFERRED EMBODIMENT

Hereinafter, the most preferred exemplary embodiments of the present disclosure will be described in detail with reference to the accompanying drawings so that those skilled in the art may easily carry out the technical spirit of the present disclosure. In the figures, even though the parts are illustrated in different drawings, it should be understood that like reference numbers refer to the same or equivalent parts of the present disclosure throughout the several figures of the drawing. Furthermore, when it is judged that specific description on known configurations or functions related in the description of the present disclosure may unnecessarily obscure the essentials of the present disclosure, the detailed description will be omitted.

Hereinafter, a method and an apparatus for determining a decoding order for shuffled decoding of LDPC codes according to an exemplary embodiment of the present disclosure will be described in detail below with reference to the accompanying drawings.

First, prior to describing a method and an apparatus for determining a decoding order for shuffled decoding of LDPC codes according to an exemplary embodiment of the present disclosure, a base matrix and mutual information of the LDPC code will be described with reference to FIG. 1.

FIG. 1 is a view for explaining a base matrix in a method and an apparatus for determining a decoding order for shuffled decoding of LDPC codes according to an exemplary embodiment of the present disclosure.

For example, in order to calculate the mutual information, the method and the apparatus for determining a decoding order for shuffled decoding of LDPC codes according to an exemplary embodiment of the present disclosure may utilize protograph-based extrinsic transfer (PEXIT) analysis algorithm based on the base matrix of the LDPC code, but the present disclosure is not limited thereto.

For example, a set of check nodes corresponding to an i-th row of the base matrix is referred to as type-i check nodes and a set of variable nodes corresponding to a j-th column is referred to as type-j variable nodes.

In this case, each type includes Z check nodes or variable nodes, Z may be equal to a lifting factor of the LDPC and a component of an i-th row and a j-th column is $b(i,j)$. When the value $b(i,j)$ is 1, it means that an type-i check node and a type-j variable node are connected to each other. In contrast, when $b(i,j)$ is 0, it means that the type-i check node and the type-j variable node are not connected and are irrelevant to each other.

In this case, an example of the base matrix and a protograph of the PEXIT analysis algorithm using the base matrix are illustrated in FIG. 1, but the present disclosure is not limited thereto.

In this case, $b(2,1)$ illustrated in FIG. 1 means a component of a first row and a second column of the base matrix and $ICH(1)$ means a reception signal received from a channel.

In the meantime, the mutual information defines an amount of information of a random variable and the mutual information may be proportional to the reliability of the information.

In this case, a more detailed description of the base matrix and the mutual information is as well known in the related art. According to the related art, the mutual information indicates relationship information between two random variables.

Now, a decoding order determining apparatus 200 for shuffled decoding of LDPC codes according to an exemplary embodiment of the present disclosure will be described with reference to FIG. 2.

FIG. 2 is a configuration diagram for explaining an apparatus for determining a decoding order for shuffled decoding of LDPC codes according to an exemplary embodiment of the present disclosure.

As illustrated in FIG. 2, the decoding order determining apparatus 200 for shuffled decoding of LDPC codes according to an exemplary embodiment of the present disclosure includes a check-variable mutual information calculating unit 210, a variable-check mutual information calculating unit 220, and an operation order determining unit 230.

According to an exemplary embodiment, the decoding order determining apparatus 200 for shuffled decoding of LDPC codes may further include a mutual information updating unit 240, but the present disclosure is not limited thereto.

For example, the decoding order determining apparatus 200 for shuffled decoding of LDPC codes according to the exemplary embodiment of the present disclosure determines a decoding order using mutual information in shuffled decoding which sequentially performs a variable node operation among decoding algorithms of the LDPC codes to calculate a variable node which is expected to propagate most reliable information to other variable node first. Therefore, it is possible to reduce the average number of iterative decoding times required for decoding the LDPC codes, but the present disclosure is not limited thereto.

The check-variable mutual information calculating unit 210 calculates check-variable mutual information which is mutual information of a message propagating from a plurality of check nodes to a plurality of variable nodes connected to the plurality of check nodes.

For example, the check-variable mutual information may be calculated based on the base matrix of the LDPC code and previous variable-check mutual information.

For example, an initial value of the previous variable-check mutual information may be set from the mutual information on a signal received from the channel.

The variable-check mutual information calculating unit 220 calculates variable-check mutual information which is mutual information of a message propagating from a plurality of variable nodes to a plurality of check nodes connected to the plurality of variable nodes based on the check-variable mutual information.

For example, the variable-check mutual information may be calculated based on the base matrix of the LDPC code, the check-variable mutual information, and mutual information on a signal received from the channel.

The operation order determining unit 230 calculates the entire mutual information which is a sum of variable-check mutual information for each of the plurality of variable nodes and determines an operation order of a variable node having the largest entire mutual information among the plurality of variable nodes to be next.

The mutual information updating unit 240 updates the check-variable mutual information and the variable-check mutual information to determine updated check-variable mutual information and updated variable-check mutual information, based on a type of a variable node whose operation order is determined to be next.

For example, an operation of calculating the check-variable mutual information and an operation of calculating the variable-check mutual information may be performed based on the updated check-variable mutual information and the updated variable-check mutual information.

For example, a decoding order determining cycle configured by the operation of calculating the check-variable mutual information, an operation of calculating the variable-check mutual information, an operation of determining a next operation order, and an operation of determining the updated check-variable mutual information and the updated variable-check mutual information may be repeatedly performed until all the operation orders of the plurality of variable nodes are determined.

In this case, the decoding order determining apparatus 200 for shuffled decoding of LDPC codes according to the exemplary embodiment of the present disclosure will be described in more detail with reference to FIGS. 3 and 4 and a redundant description will be omitted.

Now, the decoding order determining method for shuffled decoding of LDPC codes according to a first exemplary embodiment of the present disclosure will be described with reference to FIG. 3.

FIG. 3 is a flowchart for explaining a method for determining a decoding order for shuffled decoding of LDPC codes according to a first exemplary embodiment of the present disclosure.

As illustrated in FIG. 3, the decoding order determining method for shuffled decoding of LDPC codes according to the first exemplary embodiment of the present disclosure includes a step S310 of calculating check-variable mutual information, a step S320 of calculating variable-check mutual information, and a step S330 of determining an operation order of a variable node having largest entire mutual information to be next.

The step S310 may refer to a step in which the check-variable mutual information calculating unit 210 calculates check-variable mutual information which is mutual information of a message propagating from a plurality of check nodes to a plurality of variable nodes connected to the plurality of check nodes.

For example, the check-variable mutual information may be calculated based on the base matrix of the LDPC code and previous variable-check mutual information.

For example, the check-variable mutual information which is mutual information of a message propagated when a type-j variable node is calculated in step S310 may refer to mutual information of a message propagated from the check node connected to the type-j variable node to the type-j variable node when b(i,j) is 1 (the type-i check node and the type-j variable node are connected to each other).

According to an exemplary embodiment, the check-variable mutual information calculated in step S310 may be calculated based on the following Equation 1, but the present disclosure is not limited thereto.

$$I_{C2V}^E(i,j) = 1 - j\left(\sqrt{\sum_{z \neq j}^{N_b} b(i,s)[J^{-1}(1 - I_{V2C}(i,s))]^2}\right) \quad \text{[Equation 1]}$$

In this case, $I_{C2V}^E(i,j)$ is check-variable mutual information which is mutual information of a message which is transmitted from an type-i check node to a type-j variable node, J( ) refers to a function for mutual information between a binary random variable X with the same probability of 0 and 1 and a continuous Gaussuan random variable Y with input value of function as standard deviation and mean X, Nb refers to the number of row components of the base matrix, b(i,s) is a component of an i-th row and an s-th column of the base matrix, J−1( ) is an inverse function of a mutual information function, IV2C(i,s) refers to previous variable-check mutual information which is previous mutual information of a message transmitted from a type-s variable node to an type-i check node.

In this case, when the above Equation 1 is specifically described, J−1( ) is an inverse function of J( ) function which is a mutual information function, and it means a function that when an equation for the mutual information is input, a standard deviation value corresponding thereto is obtained.

In the above Equation 1, when b(i,s) which is a component of an i-th row and an s-th column of a base matrix is 0, it means that the type-i check node and the type-s variable node are not connected to each other and when b(i,s) is 1, it means that the type-i check node and the type-s variable node are connected to each other.

As a result, when b(i,s) is 1, Equation 1 performs a sum operation, so that it may be a result of summing values $[J^{-1}(1-I_{V2C}(i,s))]^2$ obtained by operating information (IV2C (i,s) received from variable nodes connected to the-type-i check node.

Here, the reason of s≠j is because in the LDPC decoding operation, when a specific node sends information to another node, in order to exclude influence by the information which has been sent to the node, the operation is performed except for the case when s is j.

In contrast, when b(i,s) is 0, it means that the type-i check node and the type-j variable node are not connected to each other so that the information is not present and the check-variable mutual information at this time is 0.

According to the exemplary embodiment, an initial value of the previous variable-check mutual information may be set by the mutual information on a signal received from the channel.

For example, the mutual information on the signal received from the channel may be calculated as represented in Equation 2, but the present disclosure is not limited thereto.

$$I_{ch} = J(\sigma_{ch}) = J(\sqrt{8R \cdot SNR_{th}}) \quad \text{[Equation 2]}$$

In this case, Ich is mutual information on the signal received from the channel, J( ) is a mutual information calculating function, $J(\sigma_{ch})$ is a function for mutual information between a binary random variable X with the same probability of 0 and 1 and a continuous Gaussian random variable Y with mean X and variance of $\sigma_{ch}^2$, R is a code rate of the LDPC code, and SNRth is a threshold SNR of the used LDPC code.

According to the exemplary embodiment of the present disclosure, an initial value of IC2V(i,j) which is mutual information of a message from the type-i check node to the type-j variable node may be set to be 0.

For example, when b(i,j) which is a component of an i-th row and a j-th column of the base matrix is 1, the initial value of IV2C(i,j) which is mutual information of a message propagated from the type-j variable node to the type-i check node may be set to be ICH.

For example, when b(i,j) which is the component of the i-th row and the j-th column of the base matrix is 0, the initial value of IV2C(i,j) which is mutual information of a message from the type-j variable node to the type-i check node may be set to be 0.

For example, in step S320, the variable-check mutual information calculating unit 220 calculates variable-check mutual information which is mutual information of a message propagating from a plurality of variable nodes to a plurality of check nodes connected to the plurality of variable nodes based on the check-variable mutual information.

For example, the step S320 may be performed on a case that b(i,j) is 1. In this case, the mutual information of a message propagating from the type-j variable node to the connected check node may be calculated as represented in the following Equation 3, but the present disclosure is not limited thereto.

$$I_{V2C}^E(i, j) = J\left(\sqrt{\sum_{s \neq i}^{M_b} b(s, j)[J^{-1}(I_{C2V}^E(s, j))]^2 + [J^{-1}(I_{ch})]^2}\right)$$ [Equation 3]

In this case, Equation 3 will be described in more detail below, but the present disclosure is not limited thereto.

In Equation 3, similarly to Equation 1, the summation is performed only when b(s,j) is 1, which means a result of summing values obtained by calculating the information received from the check nodes connected to the type-j variable node. ¥

Here, the reason of s≠i is because in the LDPC decoding operation, when a specific node sends information to another node, in order to exclude influence by the information which has been sent to the node, the operation is performed except for the case when s is i.

In the meantime, when b(i,j) is 0, it means that the type-i check node and the type-j variable node are not connected to each other. Therefore, the variable-check mutual information $I_{V2C}^E(i,j)$ calculated in this case may be 0.

As represented in Equation 3, the variable-check mutual information may be calculated based on the base matrix of the LDPC code, the check-variable mutual information, and mutual information on a signal received from the channel.

In step S330, the operation order determining unit 230 calculates the entire mutual information which is a sum of variable-check mutual information for each of the plurality of variable nodes and determines an operation order of a variable node having the largest entire mutual information among the plurality of variable nodes to be next.

For example, a method of calculating the entire mutual information for each of the plurality of variable nodes in step S330 may be as represented in Equation 4, but the present disclosure is not limited thereto.

$$S(j) = \sum_{s=1}^{M_b} b_{s,j} I_{V2C}^E(s, j)$$ [Equation 4]

In this case, S(j) refers to entire mutual information.

For example, the method of determining a variable node having the largest entire mutual information among the plurality of variable nodes in step S330 may be as represented in Equation 5, but the present disclosure is not limited thereto.

$$j_{max} = \text{argmax}_j S(j)$$ [Equation 5]

In this case, jmax refers to a type of a variable node whose order is determined to be next.

Now, the decoding order determining method for shuffled decoding of LDPC codes according to a second exemplary embodiment of the present disclosure will be described with reference to FIG. 4.

FIG. 4 is a flowchart for explaining a method for determining a decoding order for shuffled decoding of LDPC codes according to a second exemplary embodiment of the present disclosure;

Steps S410, S420, and S430 illustrated in FIG. 4 are the same as Steps S310, S320, and S330 illustrated in FIG. 3 and a redundant description will be omitted.

As illustrated in FIG. 4, the method for determining a decoding order for shuffled decoding of LDPC codes according to a second exemplary embodiment of the present disclosure may further include a step S440 of setting updated check-variable mutual information and updated variable-check mutual information and a step S450 of determining whether all operation orders of the plurality of variable nodes are determined, in addition to the steps S310, S320, and S330 illustrated in FIG. 3.

The step S440 may further include a step in which the mutual information updating unit 240 updates the check-variable mutual information and the variable-check mutual information to determine updated check-variable mutual information and updated variable-check mutual information, based on a type of the variable node whose operation order is determined to be next.

For example, the reason of updating the check-variable mutual information and the variable-check mutual information in step S440 is because in order to determine the operation order for types of all variable nodes and determine a type of a variable node which will be operated after the type of variable node whose operation time is determined to be next, the check-variable mutual information and the variable-check mutual information which have been currently operated need to be utilized.

In this case, in order to determine the type of variable node which will be operated after the type of variable node whose operation order is determined to be next, the check-variable mutual information of the above Equation 1 for the case that b(i,jmax) is 1 may be updated as represented in Equation 6 and the variable-check mutual information of the above Equation 3 may be updated as represented in Equation 7.

$$I_{C2V}(i, j_{max}) = 1 - J\left(\sqrt{\sum_{s \neq j_{max}}^{N_b} b(i, s)[J^{-1}(1 - I_{V2C}(i, s))]^2}\right)$$ [Equation 6]

In this case, IC2V(i,jmax) refers to updated check-variable mutual information.

$$I_{V2C}(i, j_{max}) = J\left(\sqrt{\sum_{s \neq i}^{M_b} b(s, j_{max})[J^{-1}(I_{C2V}(s, j_{max}))]^2 + [J^{-1}(I_{ch})]^2}\right)$$ [Equation 7]

In this case, IV2C(i,jmax) refers to updated variable-check mutual information.

That is, in order to determine the type of variable node which will be operated after the type of variable node whose operation order is determined to be next, Equation 6 and Equation 7 are utilized to update mutual information.

Next, it is determined (S450) whether the operation orders of all the plurality of variable nodes are determined. When the operation order of all the variable nodes are determined, the decoding order determining process may be completed. When the operation orders of all the plurality of variable nodes are not determined, the step S410 of calculating the check-variable mutual information and the step S420 of calculating the variable-check mutual information may be performed based on the updated check-variable mutual information and the updated variable-check mutual information.

In order words, For example, a decoding order determining cycle configured by the step S410 of calculating the check-variable mutual information, the step S420 of calculating the variable-check mutual information, the step S430 of determining a next operation order, and the step S440 of determining the updated check-variable mutual information and the updated variable-check mutual information may be repeatedly performed until all the operation orders of the plurality of variable nodes are determined.

Now, a decoding order determining method and apparatus for shuffled decoding of LDPC codes according to an exemplary embodiment of the present disclosure will be described with reference to FIG. 5.

FIG. 5 is a view for explaining a method and an apparatus for determining a decoding order for shuffled decoding of LDPC codes according to an exemplary embodiment of the present disclosure.

An example illustrated in FIG. 5 is a process for determining variable node type which will be operated second and in this example, a type-3 variable node has been determined to be operated first. In this case, a total amount of expected mutual information for each of order-undetermined variable node types needs to be calculated and FIG. 5 illustrates an operating process for a type-1 variable node.

Hereinafter, the method and the apparatus for determining a decoding order for shuffled decoding of LDPC codes according to the present disclosure will be compared with the related art with reference to FIGS. 6A, 6B, 6C, and 6D.

FIGS. 6A, 6B, 6C, and 6D are views for comparing a frame error rate and a reduction rate of the average number of iterative decoding times with the related art when a method and an apparatus for determining a decoding order for shuffled decoding of LDPC codes according to an exemplary embodiment of the present disclosure are applied to an IEEE 802.11ad standard LDPC code.

For example, in order to compare the method and the apparatus for determining a decoding order for shuffled decoding of LDPC codes according to the exemplary embodiment of the present disclosure with the related art, a normalized min-sum technique among iterative decoding operation techniques of LDPC codes is used. In this case, it is assumed that the scaling factor is 0.75, a channel environment is AWGN channel, a modulation scheme is BPSK, and the maximum number of iterative decoding times of the LDPC code decoder is 10.

FIGS. 6A, 6B, 6C, and 6D illustrate exemplary embodiments of three kinds of IEEE 802.11ad standard LDPC codes having a code length N of 672.

In each of FIGS. 6A, 6B, 6C, and 6D, the present disclosure (proposed) is compared with a first related art (Original), a second related art (CW), and a third related art (IFS).

As illustrated in FIG. 6A, as a result of comparing the present disclosure (Proposed) with the first related art (Original), the second related art (CW), and the third related art (IFS), it is confirmed that the present disclosure has an error correction capability similar to that of the related arts.

As seen from FIG. 6B illustrating that N=672 and R=½, FIG. 6C illustrating that N=672 and R=⅝, and FIG. 6D illustrating that N=672 and R=¾, it is confirmed that the present disclosure has the average number of iterative decoding times less than that of the related arts. Further, in the case of FIG. 6D, the reason that the numbers of iterative decoding times of the present disclosure, the second related art, and the third related art are the same is that the same decoding order has been determined.

Hereinafter, the method and the apparatus for determining a decoding order for shuffled decoding of LDPC codes according to the present disclosure will be compared with the related art with reference to FIGS. 7A, 7B, 7C, and 7D.

FIGS. 7A, 7B, 7C, and 7D are views for comparing a frame error rate and a reduction rate of the average number of iterative decoding times with the related art when a method and an apparatus for determining a decoding order for shuffled decoding of LDPC codes according to an exemplary embodiment of the present disclosure are applied to an IEEE 802.11n standard LDPC code.

For example, in order to compare the method and the apparatus for determining a decoding order for shuffled decoding of LDPC codes according to the exemplary embodiment of the present disclosure with the related art, a normalized min-sum technique among iterative decoding operation techniques of LDPC codes is used. In this case, it is assumed that the scaling factor is 0.75, a channel environment is AWGN channel, a modulation scheme is BPSK, and the maximum number of iterative decoding times of the LDPC code decoder is 10.

FIGS. 7A, 7B, 7C, and 7D illustrate exemplary embodiments for three kinds of IEEE 802.11n standard LDPC codes.

As illustrated in FIG. 7A, as a result of comparing the present disclosure (Proposed) with the first related art (Original), the second related art (CW), and the third related art (IFS), it is confirmed that the present disclosure has an error correction capability similar to that of the related arts.

As seen from FIG. 7B illustrating that N=1296 and R=⅔, FIG. 7C illustrating that N=1944 and R=½, and FIG. 7D illustrating that N=1944 and R=¾, it is confirmed that the present disclosure has the average number of iterative decoding times less than that of the related arts.

FIG. 8 is a view for comparing a frame error rate when a method and an apparatus for determining a decoding order for shuffled decoding of LDPC codes according to an exemplary embodiment of the present disclosure are applied to an IEEE 802.11n standard LDPC code and the maximum number of iterative decoding times is 5 and 10, with the related arts.

As illustrated in FIG. 8, as a result of comparing the frame error rate when the maximum number of iterative decoding times in IEEE 802.11n standard LDPC code (N=1944 and R=½) is 5 and 10, it is confirmed that the present disclosure shows excellent error correction capability as compared with the related arts in the less maximum number of iterative decoding times.

Although the exemplary embodiment of the present disclosure has been described above, the present disclosure may be modified in various forms. Further, it is understood that those skilled in the art may carry out various modifications and changes without departing from the claims of the present disclosure.

What is claimed is:

1. A decoding order determining method for shuffled decoding of LDPC codes, the method comprising:
calculating check-variable mutual information which is mutual information of a message propagating from a plurality of check nodes to a plurality of variable nodes connected to the plurality of check nodes, by a check-variable mutual information calculating unit;
calculating variable-check mutual information which is mutual information of a message propagating from the plurality of variable nodes to the plurality of check nodes connected to the plurality of variable nodes based on the check-variable mutual information, by a variable-check mutual information calculating unit; and
calculating the entire mutual information which is a sum of variable-check mutual information for each of the plurality of variable nodes and determines an operation order of a variable node having the largest entire mutual information among the plurality of variable nodes to be next, by an operation order determining unit,
wherein a decoding order determining cycle configured by the calculating of the check-variable mutual information, the calculating of the variable-check mutual information, and the determining of the operation order is repeatedly performed until all operation orders of the plurality of variable nodes are determined.

2. The decoding order determining method according to claim 1, wherein the check-variable mutual information is calculated based on a base matrix of LDPC codes and previous variable-check mutual information.

3. The decoding order determining method according to claim 2, wherein an initial value of the previous variable-check mutual information is set as mutual information between a binary random variable corresponding to a transmitted signal and a Gaussian Random variable corresponding to the signal received from a channel.

4. The decoding order determining method according to claim 1, wherein the variable-check mutual information and a binary random variable of a transmitted original signal are calculated based on a base matrix of LDPC codes, the check-variable mutual information, and mutual information between a binary random variable corresponding to a transmitted signal and a Gaussian Random variable corresponding to the signal received from a channel.

5. The decoding order determining method according to claim 1, further comprising:
updating the check-variable mutual information and the variable-check mutual information to determine updated check-variable mutual information and updated variable-check mutual information, based on a type of the variable node whose operation order is determined to be next, by a mutual information updating unit.

6. The decoding order determining method according to claim 5, wherein the calculating of check-variable mutual information and the calculating of variable-check mutual information are performed based on the updated check-variable mutual information and the updated variable-check mutual information.

7. The decoding order determining method according to claim 5, wherein the decoding order determining cycle is further configured by the determining of the updated check-variable mutual information and the updated variable-check mutual information.

8. A decoding order determining apparatus for shuffled decoding of LDPC codes, comprising:
a check-variable mutual information calculating unit which calculates check-variable mutual information which is mutual information of a message propagating from a plurality of check nodes to a plurality of variable nodes connected to the plurality of check nodes;
a variable-check mutual information calculating unit which calculates variable-check mutual information which is mutual information of a message propagating from the plurality of variable nodes to the plurality of check nodes connected to the plurality of variable nodes based on the check-variable mutual information; and
an operation order determining unit which calculates the entire mutual information which is a sum of variable-check mutual information for each of the plurality of variable nodes and determines an operation order of a variable node having the largest entire mutual information among the plurality of variable nodes to be next,
wherein a decoding order determining cycle configured by an operation of the check-variable mutual information calculating unit, an operation of the variable-check mutual information calculating unit, and an operation of the determining the operation order is repeatedly performed until all operation orders of the plurality of variable nodes are determined.

9. The decoding order determining apparatus according to claim 8, wherein the check-variable mutual information is calculated based on a base matrix of LDPC codes and previous variable-check mutual information.

10. The decoding order determining apparatus according to claim 9, wherein an initial value of the previous variable-check mutual information are set as mutual information between a binary random variable corresponding to a transmitted signal and a Gaussian Random variable corresponding to the signal received from a channel.

11. The decoding order determining apparatus according to claim 8, wherein the variable-check mutual information and a binary random variable of a transmitted original signal are calculated based on a base matrix of LDPC codes, the check-variable mutual information, and mutual information between a binary random variable corresponding to a transmitted signal and a Gaussian Random variable corresponding to the signal received from a channel.

12. The decoding order determining apparatus according to claim 8, further comprising:
a mutual information updating unit which updates the check-variable mutual information and the variable-check mutual information to determine updated check-variable mutual information and updated variable-check mutual information, based on a type of the variable node whose operation order is determined to be next.

13. The decoding order determining apparatus according to claim 12, wherein an operation of calculating check-variable mutual information and an operation of calculating variable-check mutual information are performed based on the updated check-variable mutual information and the updated variable-check mutual information.

14. The decoding order determining apparatus according to claim 12, wherein the decoding order determining cycle is further configured by an operation of the determining the updated check-variable mutual information and the updated variable-check mutual information.

\* \* \* \* \*